United States Patent [19]
Kashmiri et al.

[11] Patent Number: 5,883,528
[45] Date of Patent: Mar. 16, 1999

[54] FIVE VOLT TOLERANT TTL/CMOS AND CMOS/CMOS VOLTAGE CONVERSION CIRCUIT

[75] Inventors: Abdul Qayyum Kashmiri, Fremont; Junaid Ahmed Ahmed, Milpitas; Han My Kim, Fremont, all of Calif.

[73] Assignee: Cirrus Logic, Inc., Fremont, Calif.

[21] Appl. No.: 822,375

[22] Filed: Mar. 20, 1997

[51] Int. Cl.⁶ ............................................... H03K 19/0948
[52] U.S. Cl. ............................... 326/71; 326/34; 326/83; 326/50
[58] Field of Search ................... 326/68, 70, 71, 326/63, 31, 34, 83, 86, 121, 49, 50, 62

[56] References Cited

U.S. PATENT DOCUMENTS

| | | | |
|---|---|---|---|
| 4,978,867 | 12/1990 | Pfennings | 307/296.6 |
| 5,166,558 | 11/1992 | Ohsawa | 326/71 |
| 5,469,082 | 11/1995 | Bullinger et al. | 326/81 |
| 5,477,172 | 12/1995 | Schnizlein | 327/99 |
| 5,521,531 | 5/1996 | Okuzumi | 326/81 |
| 5,528,172 | 6/1996 | Sundstrom | 326/80 |
| 5,589,783 | 12/1996 | McClure | 326/71 |

*Primary Examiner*—Michael Tokar
*Assistant Examiner*—Qui Van Duong
*Attorney, Agent, or Firm*—Robert P. Bell; Steven A. Shaw

[57] ABSTRACT

An input circuit to a semiconductor device may selectively accept different voltage logic levels (e.g., TTL or CMOS) as selected by a preset selection signal. The selection signal activates an N-type or P-type transistor in the input circuit which alters the threshold switching voltage of the input circuit logic. By altering the input threshold voltage, both TTL and CMOS input signals may be correctly triggered. An additional circuitry may be provided to allow a low voltage circuit (e.g., 3.3 Volts) to be tolerant of higher voltage inputs (e.g., 5 Volts). An isolation transistor isolates the input of the circuit from the high voltage signal, while a pulldown transistor pulls a high logic, high voltage signal down to supply voltage level.

15 Claims, 7 Drawing Sheets

| PDOWN | INPUT | TTL-CMOS | 1350 | U342A | 1343A | U342B | 1343B | POWER-DOWN | | LOGIC | | TTL-CMOS | | HYSTERESIS | | 5 VOLT | | 1341 |
|---|---|---|---|---|---|---|---|---|---|---|---|---|---|---|---|---|---|---|
| | | | | | | | | P342 | N342 | P341 | N341 | P346 | N351 | P308 | N308 | N315 | N316 | |
| 0 | 0 | 0 | 1 | 1 | 0 | 1 | 0 | OFF | ON | ON | OFF | ON | OFF | OFF | OFF | OFF | ON | 0 |
| 0 | 0 | 1 | 1 | 1 | 0 | 0 | 1 | OFF | ON | ON | OFF | OFF | OFF | OFF | ON | OFF | ON | 0 |
| 0 | 1 | 0 | 1 | 1 | 0 | 0 | 1 | OFF | ON | OFF | ON | OFF | OFF | ON | OFF | ON | ON | 1 |
| 0 | 1 | 1 | 1 | 0 | 1 | 0 | 1 | OFF | ON | OFF | ON | OFF | ON | ON | OFF | ON | ON | 1 |
| 1 | 0 | 0 | 0 | 1 | 0 | 1 | 0 | ON | OFF | ON | OFF | ON | OFF | OFF | OFF | OFF | ON | 0 |
| 1 | 0 | 1 | 0 | 1 | 0 | 0 | 1 | ON | OFF | OFF | ON | OFF | OFF | OFF | ON | ON | ON | 0 |
| 1 | 1 | 0 | 0 | 1 | 0 | 1 | 1 | ON | OFF | ON | OFF | OFF | OFF | OFF | ON | ON | ON | 0 |
| 1 | 1 | 1 | 0 | 0 | 1 | 0 | 1 | ON | OFF | OFF | ON | OFF | OFF | OFF | ON | ON | ON | 0 |

TABLE V

Figure 7

FIVE VOLT TOLERANT TTL/CMOS AND CMOS/CMOS VOLTAGE CONVERSION CIRCUIT

FIELD OF THE INVENTION

The present invention relates generally to the field of semiconductor integrated circuits, more specifically to a method and apparatus for selectively converting TTL or CMOS input voltage levels to CMOS voltage levels in an input or output buffer of a semiconductor integrated circuit.

BACKGROUND OF THE INVENTION

As new semiconductor technologies emerge, new standards for logic level voltage levels may also be applied. Transistor-Transistor Logic (TTL) circuits of the prior art typically use a 0–5 Volt supply voltage to generate a 0.4 to 3.4 Volt output signal. Low Voltage TTL (LVTTL) may generate a 0.4 to 2.4 Volt output signal.

Newer Complimentary Metal Oxide Semiconductor (CMOS) circuits may operate within a large range of supply voltages (e.g., as high as 15 Volts) and thus may operate with a 0–3.3 or 0–5.0 volt input or output signal. Table I illustrates examples of cutoff and threshold levels for logical high and low levels for LVTTL and CMOS circuits.

TABLE I

| DESCRIPTION | (LV)TTL Voltage | CMOS Voltage |
| --- | --- | --- |
| $V_{IL}$ | $V_{IL}$ = 0.8 V | $V_{IL}$ = 0.28 × Vdd |
| $V_{IH}$ | $V_{IH}$ = 2.0 V | $V_{IH}$ = 0.8 × Vdd |
| $V_{TH}$ | $V_{TH}$ = 1.4 V | $V_{TH}$ = Vdd/2 |
| Nominal HIGH | 2.4 Volts | Vdd |
| Nominal LOW | 0.4 Volts | 0 Volts |
| Vdd (Nominal) | 5.0 Volts | 3–15 Volts |

Note that TTL and LVTTL logic may be specified in terms of absolute voltage levels. However, in CMOS circuits, due to the variation in the available span of voltage levels, as well as the wide variety of available supply voltage levels for CMOS use (e.g., 3–15 Volts), logic levels may be characterized in terms of a fraction of supply voltage.

In many applications, supply voltage for CMOS use may be selected from 3.3 or 5.0 Volts. In the present invention, unless otherwise noted, it will be presumed that supply voltage Vdd will be 5.0 Volts for all circuits, and thus CMOS signal levels may vary between 0 and 5 Volts, while TTL signal levels may vary between 0 and 2.4 Volts. Note, that in a typical circuit with a given supply voltage (e.g., Vdd= 3.3 Volts), supply voltage Vdd may be vary within a specified range (e.g., 3.0 to 3.6 Volts).

For the purposes of this application, LVTTL signals will be referred to as TTL signals for the sake of brevity. The advent of lower supply voltages has lead to an increased use of LVTTL circuitry where Transistor-Transistor Logic is to be used. Thus, the terms LVTTL and TTL have come to be used interchangeably.

In the prior art, it has been recognized that a conversion circuit or circuits may be required to convert TTL logic level signals to CMOS logic level signals (and vice versa) in a reliable manner. Newer semiconductor technologies may be driven by even lower voltage levels (e.g., 2 Volts, 1.8 Volts, or the like) in order to reduce power consumption and heat dissipation. Thus, there may be a continued need for such voltage level conversion circuits in the future as well.

In addition, other logic families having reduced-swing logic voltage levels are known in the art, including BTL, CTT, ETL, GTL, KTL, LTL, LVSC, LVTTL, and the like, as well as other known logic level families such as RTL, DCTL, DTL, HTL, ECL, I²L, and the like. Thus, there remains a continued requirement for voltage conversion circuits to convert logical voltage levels.

In addition, a certain amount of hysteresis may be present in logic circuits. In other words, a circuit may be triggered to change state at a rising voltage level (e.g., 2.0 Volts for a TTL Low to High transition), and be triggered to change state again at a different, lowering voltage level (e.g., 0.8 Volts for a TTL High to Low transition. Thus, a certain amount of hysteresis may be present in a logic circuit, and these hysteresis values may differ for different logic families.

SUMMARY OF THE INVENTION

The threshold triggering voltage for an input circuit to a semiconductor device may be selectively altered for either TTL or CMOS high or low level inputs.

In a first embodiment, when a TTL high level signal is to be input, an additional N-type MOS transistor is switched into the input circuit to alter the threshold voltage for detecting a high level logic signal.

In a second embodiment, when a CMOS high level logic signal is to be input, an additional P-type MOS transistor is switched into the input circuit to alter the threshold voltage for detecting a high level logic signal. The P-type MOS transistor is switched off when receiving LVTTL level input signals.

In a third embodiment, an input circuit operating according to either of the principles of the first and second embodiments, and supplied at a CMOS level supply voltage, switches an additional P-type MOS transistor into the input circuit when a TTL high level logic signal is to be input. The additional P-type MOS transistor restores the input voltage level to supply voltage Vdd, while an additional N-type MOS transistor acts as an isolation device.

In a fourth embodiment of the present invention, which may encompass elements of the first through third embodiments of the present invention, additional P- and N-type MOS transistors are provided to compensate for hysteresis effects in digital switching circuits.

Figure 4:
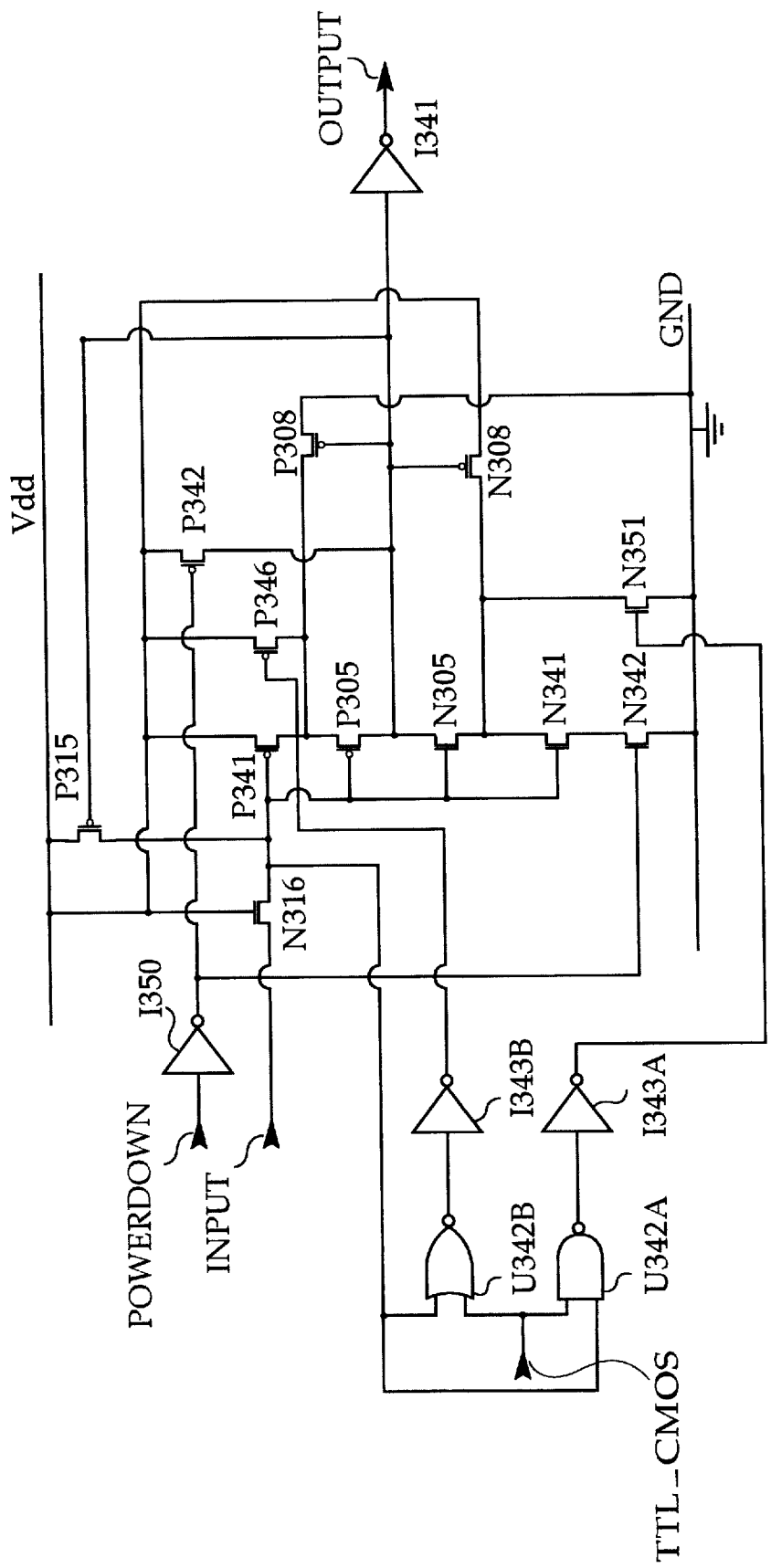
FIG. 4 is a schematic illustrating a hysteresis compensated TTL/CMOS conversion circuit.

Table V is a logical truth table for the schematic of FIG. 4.

DETAILED DESCRIPTION OF THE INVENTION

In a semiconductor device, input signals may be received through contact pads located on the periphery of the semiconductor chip. Each of such pads may receive a particular signal and have an associated buffer circuit for buffering the input signal.

In the preferred embodiment of the present invention, such input buffers may be provided with a powerdown circuit for receiving a powerdown signal indicating that the semiconductor device is to be placed in a sleep or suspend mode. Depending upon the nature of the input signal, the associated buffer may be required to output a high or low logic level signal in response to such a power down signal.

Figure 1:
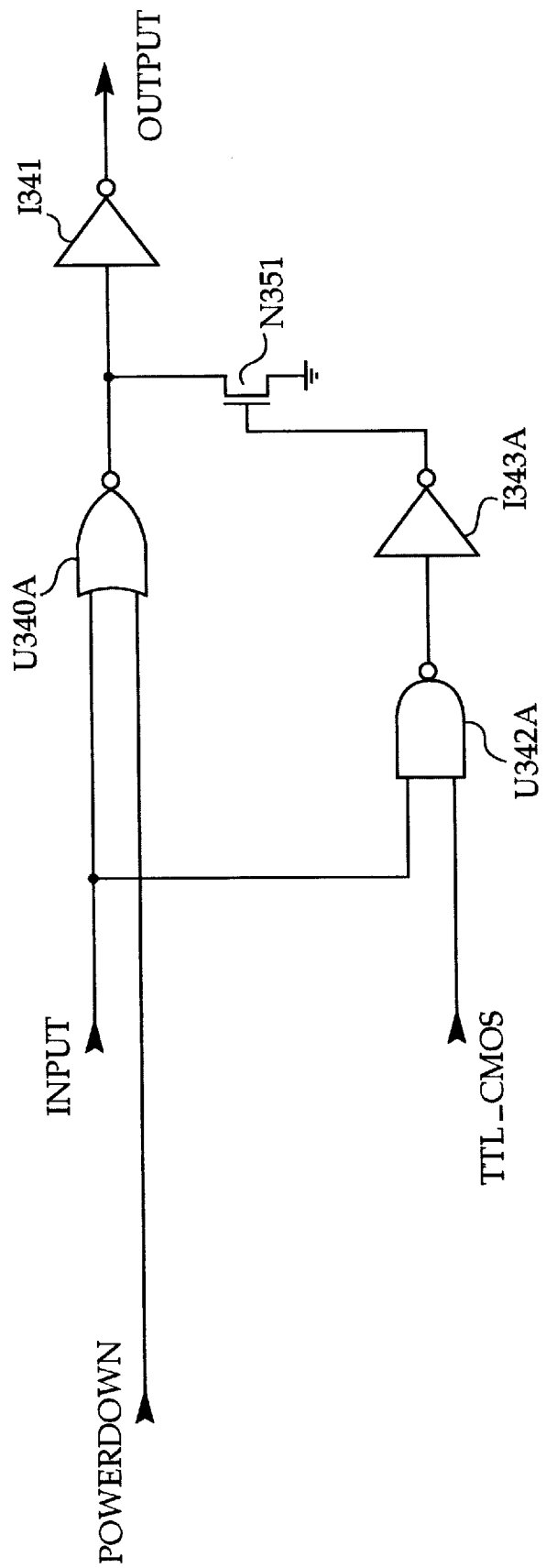
FIG. 1 is a schematic illustrating an input buffer for a semiconductor circuit having a nominally high output value when in a powerdown mode.
Figure 2:
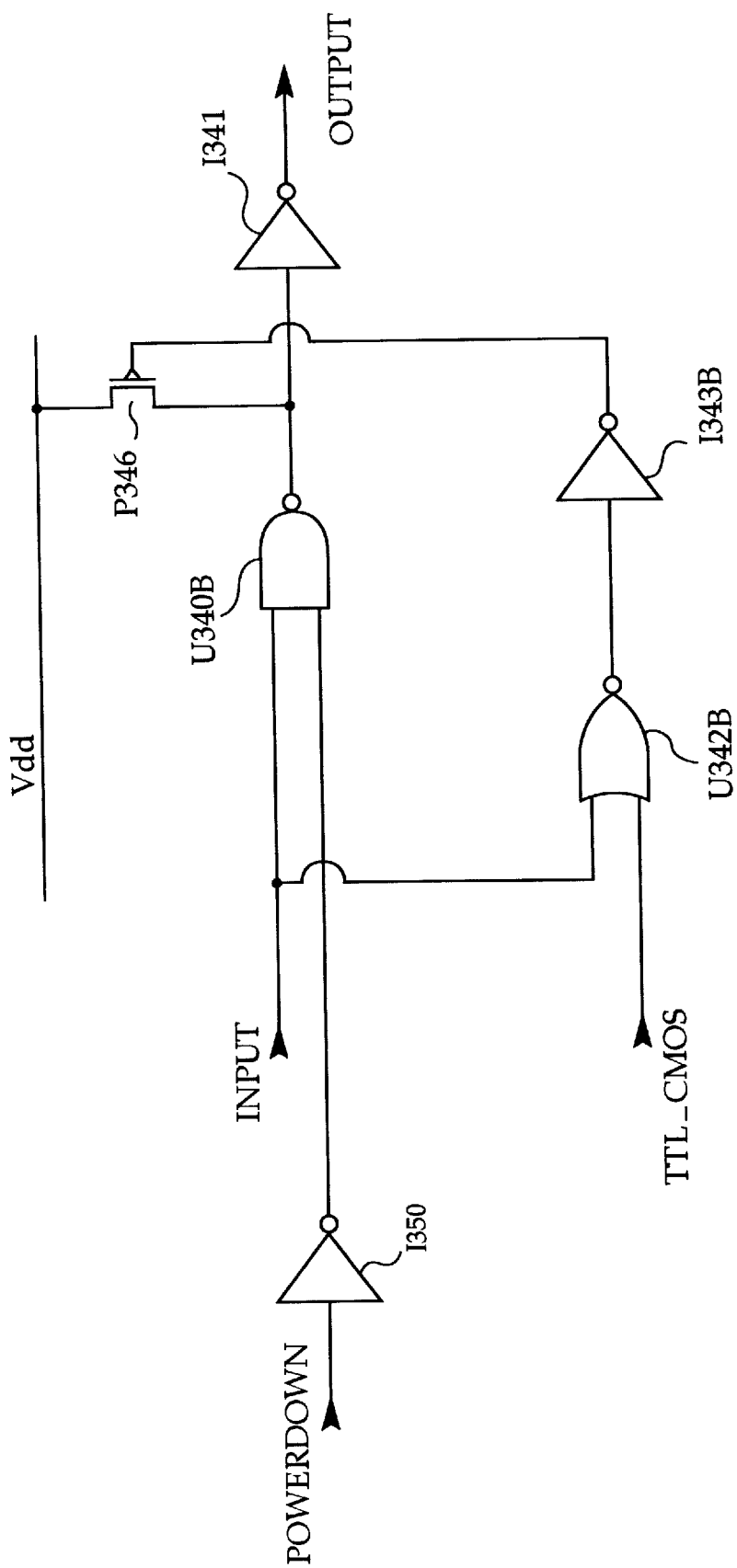
FIG. 2 is a schematic illustrating an input buffer for a semiconductor circuit having a nominally low output value when in a powerdown mode.

For example, for a CMOS memory, a clock signal CLK may be held low during a power down mode, whereas other memory signals may be held high to preserve data within the memory. Thus, FIGS. 1 and 2 are schematics illustrating two buffers which provide respective high and low output values when a POWERDOWN mode signal is asserted. Thus, a number of pads of a semiconductor device may be provided with a circuit of FIGS. 1 or 2 in the preferred embodiment of the present invention. while the circuits of the present invention may be applied to any type of semiconductor circuit, in the preferred embodiment, they are applied to a mass storage controller (e.g., CD-ROM, DVD, or hard drive controller, or the like).

Table II is a truth table illustrating the values of various input and output signals for components of FIG. 1. Each column refers to an input signal or the output go or state of a particular device within FIG. 1. Signal INPUT represents the input to the associated pad (i.e., pin) of a semiconductor device. The output signal OUTPUT is represented by the output of inverter I341. Signal OUTPUT may then be fed to whatever circuit or circuits the particular pad in the semiconductor device is intended to drive.

low according to the environment in which the system is to be used. Note also that other voltage levels or types may be used without departing from the spirit and scope of the present invention.

As such devices are typically placed in one specific environment for use, the need for automatic detector circuitry may be superfluous. Thus, setting a register bit or holding a device pin high or low may be a much more cost-effective way (in terms of gate count) of providing TTL or CMOS voltage level selectability.

Referring back to Table II, note that when N-type MOSFET transistor N351 will turn on when signal TTL_CMOS is high (TTL mode) and signal INPUT is high. Signal OUTPUT should vary between 0 and 5.0 Volts (nominal). Input CMOS level signals (e.g., 0–5.0 Volts) may propagate normally. Input TTL low level signals (e.g., low logic level 0–0.8 Volts) will be interpreted by logic gates as low logic level CMOS signals.

However, high level TTL signals, as applied in the present invention, may trigger at 1.4–2.4 Volts. As a CMOS circuit is designed to trigger for a high level logic input greater than Vdd/2, such a circuit may not properly trigger even at a supply voltage Vdd as low as 5.0 Volts (i.e., $V_{1H}$=Vdd/2=2.5 Volts). Thus, the performance of NOR gate U340 must be modified or altered in such situations to insure proper triggering.

Figure 5:
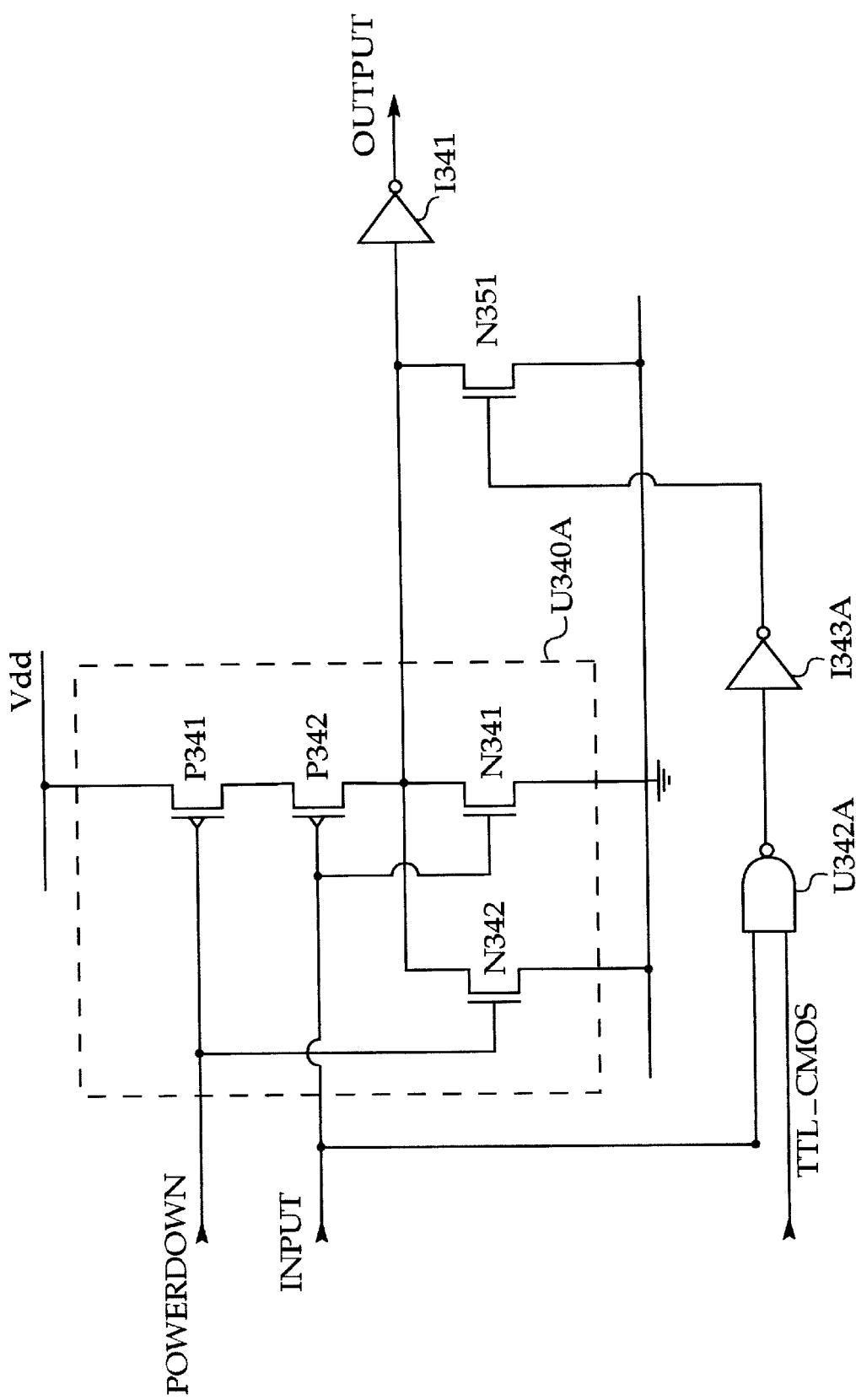
FIG. 5 is a schematic diagram of FIG. 1 including internal details of NOR gate U340.

FIG. 5 is a schematic diagram which expands upon the logic circuit of FIG. 1. In FIG. 5, NOR gate 340 is shown comprised of P-type MOS transistors P341 and P342 and N-type MOS transistors N341 and N342.

When signal POWERDOWN is high (i.e., powerdown mode on), transistor P341 is off, transistor N342 conducts,

TABLE II

| P'DOWN | INPUT | TTL_CMOS | U340A | U342A | I343A | N351 | I341 |
|---|---|---|---|---|---|---|---|
| 0 | 0 | 0 | 1 | 1 | 0 | OFF | 0 |
| 0 | 0 | 1 | 1 | 1 | 0 | OFF | 0 |
| 0 | 1 | 0 | 0 | 1 | 0 | OFF | 1 |
| 0 | 1 | 1 | 0 | 0 | 1 | ON | 1 |
| 1 | 0 | 0 | 0 | 1 | 0 | OFF | 1 |
| 1 | 0 | 1 | 0 | 1 | 0 | OFF | 1 |
| 1 | 1 | 0 | 0 | 1 | 0 | OFF | 1 |
| 1 | 1 | 1 | 0 | 0 | 1 | ON | 1 |

Examining Table II closely, one will note that logically, the output of inverter I341 (signal OUTPUT) will mirror input signal INPUT for the first four entries where value of signal POWERDOWN is low. When signal POWERDOWN is high, the output of inverter I341 (signal OUTPUT) is held high, regardless of the values for signals INPUT and TTL_CMOS. Also note that signal INPUT is properly propagated regardless of whether signal TTL_CMOS is high or low, so long as signal POWERDOWN is low.

When signal TTL_CMOS is low (i.e., TTL_CMOS=0) it is presumed that signal INPUT ranges from 0 to 5 Volts (i.e., CMOS voltage level). When signal TTL_CMOS is high (i.e., TTL_CMOS=1) it is presumed that signal INPUT ranges from 0 to 3.3 Volts (i.e., LVTTL voltage levels). Signal TTL_CMOS may be generated from an external pin of the device, or from a bit from an internal register. A system designer may design a system in which the TTL_CMOS pin is held high or low, depending upon whether the device is to be used in a LVTTL or CMOS voltage level environment. Alternately, a system designer may program software to drive a device register bit TTL_CMOS high or and the output of NOR gate U340 will be low. When signal Powerdown is low (i.e., powerdown mode off) and signal INPUT is low, transistors P341 and P342 conduct and transistors N341 and N342 are off and the output of NOR gate U340 goes high.

When signal POWERDOWN is low (i.e., powerdown mode off), signal TTL_CMOS is high (i.e., TTL mode) and signal INPUT is high, transistors N341 and N351 will conduct, and the output of NOR gate U340 will be low.

By turning on N-type MOS transistor N351, essentially a second N-type MPS transistor has been placed in the circuit, in parallel to N-type MOS transistor N341. In CMOS circuits, complimentary MOS transistors may be provided, with each type having differing gate widths, or relative powers (e.g., strong or weak), in order to provide a balanced CMOS circuit, due to the different transistor characteristics of P-type and N-type MOS transistors and design point threshold voltages.

For TTL logic level applications, such transistor circuits must be provided with a relative ratio of P/N=1:4. For CMOS type circuits, the ratio may be closer to 2:1. P-type MOS transistors are inherently weaker due to the low mobility of holes, and hence the width of a P-type MOS transistors is typically double that of an N-type MOS transistor in order to equal the strength of an N-type MOS transistor in rise and fall times.

By placing an additional N-type MOS transistor N351 into the circuit, the P/N ratio is correspondingly altered, and the high logic level trigger point of NOR gate U340 is reduced to approximately 1.4 Volts. As such, the circuit of FIGS. 1 and 5 will properly trigger for a TTL high logic level signal of 1.4 to 2.4 Volts.

In order to insure that N-type MOS transistor N351 is properly triggered, NAND gate U342A may be designed such that it will always trigger when the input level is a TTL logic level. As the signal TTL_CMOS is also required to trigger N-type MOS transistor N351, there is little danger that N-type MOS transistor N351 will be triggered accidentally.

Thus, the circuit of FIG. 1 will provide an input NOR gate U340 which will selectably and reliably trigger to both TTL and CMOS levels.

FIG. 2 is a schematic diagram illustrating a second embodiment of the present invention where signal OUTPUT of the buffer circuit is to remain low when signal POWERDOWN is asserted. Note that in the preferred embodiment of the present invention, the first input gate for signal INPUT may be a gate enabling signal POWERDOWN. However, the TTL/CMOS level conversion circuit of the present invention may be applied to other initial gates without departing from the spirit and scope of the present invention.

In the preferred embodiment, an initial gate controls signal POWERDOWN. However, other gates may also be used (e.g., in circuits where no powerdown command is used) or even a dummy gate (e.g., AND gate or equivalent with one leg tied to Vdd) may be used. Alternately, an inverter for voltage level translation may be used in place of NAND gate U340B.

In FIG. 1, the circuit was configured to trigger to CMOS input voltage levels, and modified (via N-type MOS transistor N341) to correctly trigger at TTL high logic voltage levels. The circuit of FIG. 2 is configured to trigger correctly at TTL logic voltage levels, and is provided with an additional transistor P346 to insure that CMOS low logic voltage levels correctly trigger.

Table III is a truth table illustrating the values of various input and output signals for components of FIG. 2. Each column refers to an input signal or the output or state of a particular device. The output signal OUTPUT is represented by the output of inverter I341.

of signal POWERDOWN is low. When signal POWERDOWN is high, the output of inverter I341 (signal OUTPUT) is held low, regardless of the values for signals INPUT and TTL_CMOS. Also note that signal INPUT is properly propagated regardless of whether signal TTL_CMOS is high or low, so long as signal POWERDOWN is low.

Referring to Table III, note that when P-type MOSFET transistor P346 will turn on when signal TTL_CMOS is low (CMOS mode) and signal INPUT is low. Signal OUTPUT should vary between 0 and 5.0 Volts (nominal) where Vdd=5.0 Volts. Input TTL level signals (e.g., 0–2.4 Volts) may propagate normally through the circuit.

However, low logic level CMOS signals, as applied in the present invention, may trigger at 0.28×Vdd or 1.4 Volts where Vdd=5.0 Volts. As a TTL circuit is designed to trigger for a high logic input of 1.4–2.0 Volts, such a circuit may not properly distinguish between a high level TTL signal and a low level CMOS signal. Thus, the performance of NAND gate U340 must be modified or altered in such situations to insure proper triggering.

Figure 6:
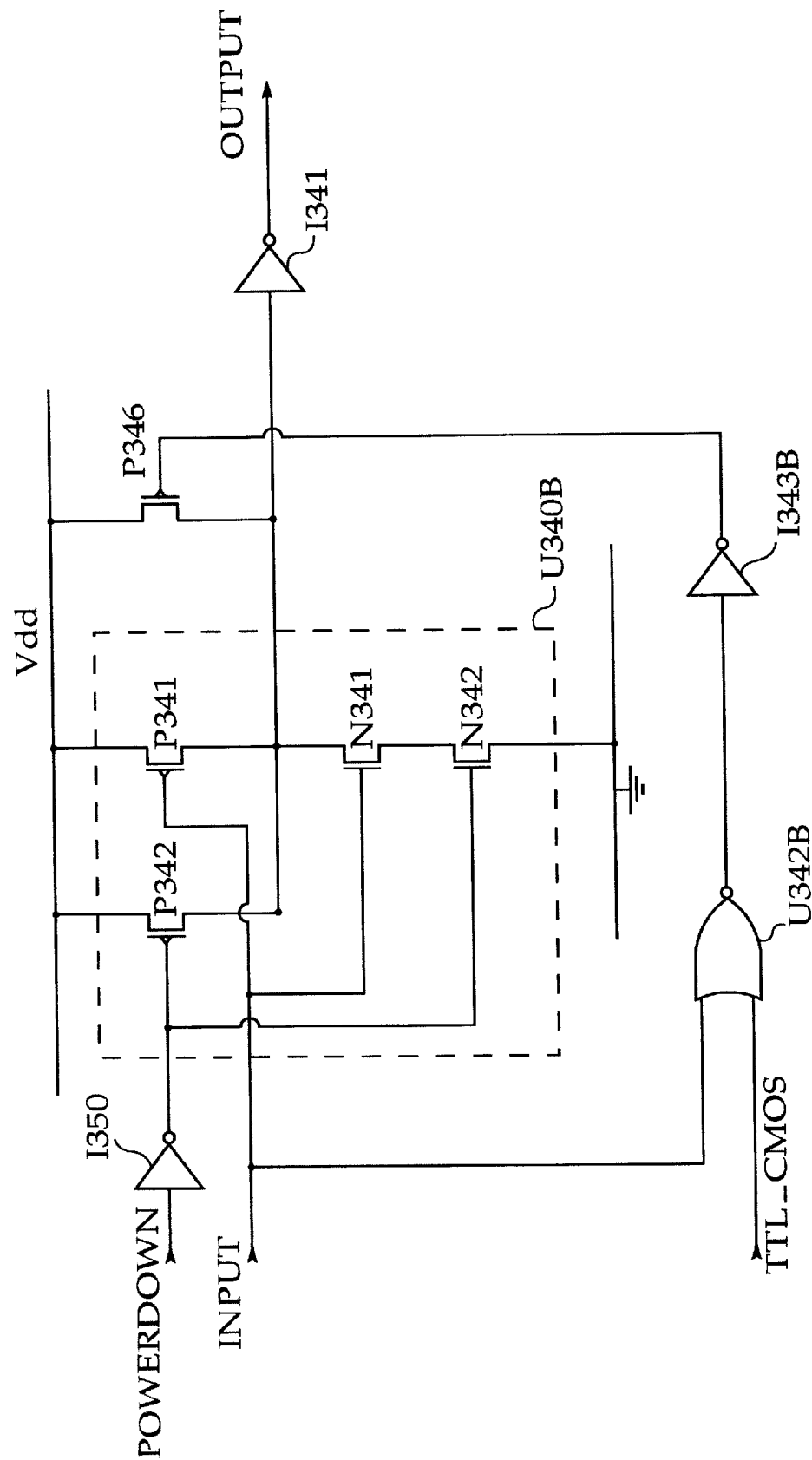
FIG. 6 is a schematic diagram of FIG. 2 including internal details of NAND gate U340.

FIG. 6 is a schematic diagram which expands upon the logic circuit of FIG. 2. In FIG. 6, NAND gate 340 is shown comprised of P-type MOS transistors P341 and P342 and N-type MOS transistors N341 and N342.

When signal POWERDOWN is high (i.e., powerdown mode on), inverter I350 inverts this signal and turns transistor N342 off while transistor P342 conducts, and the output of NAND gate U340 will go high. When signal Powerdown is low (i.e., powerdown mode off) and signal INPUT is low, transistors P341 and N341 conduct and transistors N341 and P342 are off and the output of NOR gate U340 goes high.

When signal POWERDOWN is low (i.e., powerdown mode off), signal TTL_CMOS is low (i.e., CMOS mode) and signal INPUT is low, transistors P341 and P346 will conduct, and the output of NOR gate U340 will be high.

By turning on P-type MOS transistor P346, essentially a second P-type transistor has been placed in the circuit, in parallel to P-type MOS transistor P341. By placing an additional P-type MOS transistor P346 into the circuit, the P/N ratio is correspondingly altered, and the low logic level trigger point of NAND gate U340 may be raised to approximately 0.8 Volts.

In order to insure that P-type MOS transistor P346 is properly triggered, NOR gate U342 may be designed such that it will always trigger low when a TTL level signal is input. As a low level value of signal TTL_CMOS is also required to trigger P-type MOS transistor P346, there is little danger that P-type MOS transistor P346 will be triggered accidentally.

TABLE III

| P'DOWN | INPUT | TTL_CMOS | I350 | U340B | U342B | I343B | P346 | I341 |
|--------|-------|----------|------|-------|-------|-------|------|------|
| 0 | 0 | 0 | 1 | 1 | 1 | 0 | ON | 0 |
| 0 | 0 | 1 | 1 | 1 | 0 | 1 | OFF | 0 |
| 0 | 1 | 0 | 1 | 0 | 0 | 1 | OFF | 1 |
| 0 | 1 | 1 | 1 | 0 | 0 | 1 | OFF | 1 |
| 1 | 0 | 0 | 0 | 1 | 1 | 0 | ON | 0 |
| 1 | 0 | 1 | 0 | 1 | 0 | 1 | OFF | 0 |
| 1 | 1 | 0 | 0 | 1 | 0 | 1 | OFF | 0 |
| 1 | 1 | 1 | 0 | 1 | 0 | 1 | OFF | 0 |

Examining Table III closely, one will note that logically, the output of inverter I341 (signal OUTPUT) will mirror input signal INPUT for the first four entries where the value Thus, the circuit of FIG. 2 will provide an input NAND gate U340 which will selectably and reliably trigger to both TTL and CMOS levels.

Figure 3:
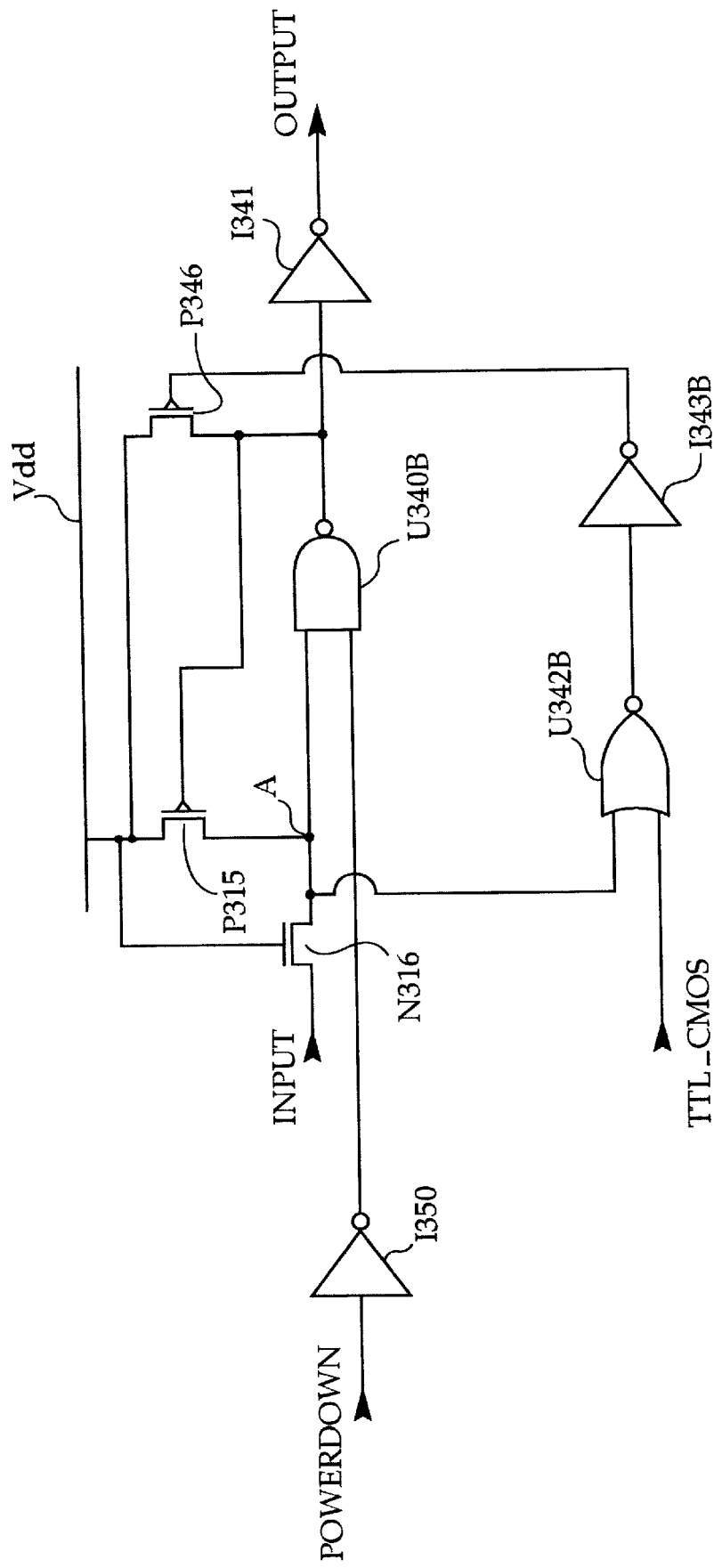
FIG. 3 is a schematic illustrating an 5 Volt tolerant input buffer for a 3.3 Volt powered semiconductor circuit having a nominally low output value when in a powerdown mode.

FIG. 3 is a schematic of a 5-volt tolerant TTL/CMOS conversion circuit which may accept TTL or CMOS voltage logic levels. In the circuits of FIGS. 1 and 2, it was presumed that if a 5-Volt input was to be used, that the associated supply voltage to the gates Vdd would also be 5 volts. A logic gate (or MOS transistor) supplied with a 3.3 Volt power supply voltage (Vdd) and a 5 Volt input signal may not function properly and the gate to drain voltage may exceed the source to drain voltage.

The circuit of FIG. 3 solves this problem by providing a 5-Volt tolerant circuit. Such a circuit may eliminate the need for dual voltage supplied on a semiconductor circuit. The circuit of FIG. 3 is similar to that of FIG. 2, in that both circuits will output a low level logic signal in response to a high level POWERDOWN signal. However, one of ordinary skill in the art may appreciate that the principles of the circuit of FIG. 3 may also be applied to the circuit of FIG. 1 as well.

Table IV is a truth table illustrating the values of various input and output signals for components of FIG. 3. Each column refers to an input signal or the output or state of a particular device. The output signal OUTPUT is represented by the output of inverter I341.

TABLE IV

| P'DOWN | INPUT | TTL_CMOS | I350 | U340B | U342B | I343 | P346 | P315 | I341 |
|---|---|---|---|---|---|---|---|---|---|
| 0 | 0 | 0 | 1 | 1 | 1 | 0 | ON  | OFF | 0 |
| 0 | 0 | 1 | 1 | 1 | 0 | 1 | OFF | OFF | 0 |
| 0 | 1 | 0 | 1 | 0 | 0 | 1 | OFF | ON  | 1 |
| 0 | 1 | 1 | 1 | 0 | 0 | 1 | OFF | ON  | 1 |
| 1 | 0 | 0 | 0 | 1 | 1 | 0 | ON  | OFF | 0 |
| 1 | 0 | 1 | 0 | 1 | 0 | 1 | OFF | OFF | 0 |
| 1 | 1 | 0 | 0 | 1 | 0 | 1 | OFF | OFF | 0 |
| 1 | 1 | 1 | 0 | 1 | 0 | 1 | OFF | OFF | 0 |

Examining Table IV closely, one will note that logically, the output of inverter I341 (signal OUTPUT) will mirror input signal INPUT for the first four entries where the value of signal POWERDOWN is low. When signal POWERDOWN is high, the output of inverter I341 (signal OUTPUT) is held low, regardless of the values for signals INPUT and TTL_CMOS. Also note that signal INPUT is properly propagated regardless of whether signal TTL_CMOS is high or low, so long as signal POWERDOWN is low. In this regard, Tables III and IV have similar truth table values.

However, the circuit of FIG. 3 is provided with two additional MOS transistors P315 and N316 to allow the circuit to be 5-Volt tolerant. N-type MOS transistor N316 has its gate coupled to supply voltage Vdd, which in this instance, may be nominally 3.3 Volts, and thus is always conducting. Node A thus cannot rise above Vdd-Vth, and thus N-type MOS transistor N316 acts as an isolation device. P-type MOS transistor P315 has its gate coupled to the output of NAND gate U340. Thus, P-type MOS transistor P315 will turn on when the output of NAND gate U340 is low, or stated another way, when signal INPUT is high, bringing node A to Vdd.

When signal INPUT is high, transistors P315 and N316 both conduct and act to pull an input voltage of 5 Volts down to supply voltage Vdd (e.g., 3.3 Volts nominal). Thus, the input to NAND gate U340B is reduced to supply voltage Vdd when signal INPUT is high, regardless of whether signal INPUT is at 3.3 or 5 volts. Transistor N316 acts as an isolation device between a 5 Volt input signal and a 3.3 Volt supply voltage.

FIG. 4 is a schematic illustrating a hysteresis compensated TTL/CMOS conversion circuit. After reviewing FIGS. 1–3, one will note some similarities between FIG. 4 and FIGS. 1–3, and common circuit elements have been commonly labeled. In particular, FIG. 4 includes the 5-Volt tolerant circuit elements of FIG. 3 in the form of N-type MOS transistor N316 and P-type MOS transistor P315. FIG. 4 also includes combined circuit elements of FIGS. 1 and 2.

Table V is a truth table illustrating the operation of the circuit of FIG. 4. As can be seen from Table V, then signal POWERDOWN is low, input signal INPUT will properly propagate through the circuit to output signal OUTPUT. When signal POWERDOWN is high, signal OUTPUT will remain low.

Referring to Table V, when signal TTL_CMOS is low and signal INPUT is high, P-type MOS transistor P346 will be turned off in a similar manner as in FIG. 2 to alter the threshold voltage for high level logic detection of TTL signals (i.e., 2.0 Volts as high, as compared to low level for CMOS). When signal TTL_CMOS is high (and signal INPUT is high), N-type MOS transistor N351 will be turned on in a similar manner as in FIG. 1 to alter the threshold voltage for high level logic detection for TTL to CMOS conversion.

N-type MOS transistor N316 and P-type MOS transistor P315 perform similar functions to that in FIG. 3 to provide tolerance to 5-Volt input signals. P-type MOS transistor P315 will turn on when signal INPUT is high, and act with N-type MOS transistor N316 as a voltage divider to reduce input voltage from 5 Volts to supply voltage Vdd.

N-type MOS transistor N308 and P-type MOS transistor P308 are added to the circuit of FIG. 4 to provide a hysteresis (e.g., Schmitt trigger) effect. When signal INPUT transitions from low to high, N-type MOS transistors N305 and N341 conduct, pulling the input to inverter I341 low, turning on P-type MOS transistor P308 and turning off N-type MOS transistor N308.

When signal INPUT transitions from high to low, P-type MOS transistors P305 and P341 conduct, pulling the input to inverter I341 high, turning on N-type MOS transistor N308 and turning off P-type transistor P308. However, as P-type transistor P-308 had been conducting, pulling the junction of P-type MOS transistors P341 and P305 to ground, the trigger level of the circuit of FIG. 4 for the high to low transition is lower than that for the low to high transition. N-type transistor N308 similarly serves to slightly raise the trigger level for the low to high transition.

Thus, the overall effect is to introduce some hysteresis in the circuit, a phenomenon commonly associated with Schmitt trigger device. Such hysteresis may be desirable in order to prevent false triggering of the input circuit of FIG. 4 due to minor fluctuations in input voltage.

Although the present invention has been illustrated and described in detail, it is clearly understood that the same is by way of illustration and example only and is not to be taken by way of limitation, the scope and spirit of the present invention being limited only the terms of the appended claims.

What is claimed is:

1. A circuit for accepting input digital logic signals of a first or second group of logic levels, said circuit comprising:

input logic, for receiving input digital logic signals of a first or a second group of logic levels, said input logic having switching threshold voltages for triggering on at least input digital logic signals of the first group and propagating the input digital logic signals of the first group of logic levels;

a selection input for receiving a selection signal indicating whether input digital logic signals are of a first or a second group of logic levels;

at least one transistor, coupled to the input logic and the selection input, said at least one transistor being selectively activated when the selection signal indicates input digital logic signals are of a second group of logic levels and when the input signal is at at least one of the second group of logic levels, said at least one transistor altering a switching threshold voltage of said input logic for triggering on at least input digital logic signals of the second group and propagating the input digital logic signals of the second group of logic levels.

2. The circuit of claim 1, wherein said input logic comprises a NAND gate comprising an equal number of N-type and P-type CMOS transistors.

3. The circuit of claim 2, wherein said at least one transistor comprises an N-type CMOS transistor coupling an output of said NAND gate to ground voltage when activated.

4. The circuit of claim 1, wherein said input logic comprises a NOR gate comprising an equal number of N-type and P-type CMOS transistors.

5. The circuit of claim 4, wherein said at least one transistor comprises a P-type CMOS transistor coupling an output of said NAND gate to supply voltage when activated.

6. The circuit of claim 1 further comprising:

an isolation transistor coupled to an input of said input logic for receiving the input digital logic signals of a first or a second group of logic levels, for isolating an input voltage higher than a supply voltage of the circuit.

7. The circuit of claim 6, further comprising:

a pulldown transistor, coupling the input of said input logic for receiving the input digital logic signals of a first or a second group of logic levels to supply voltage, said pulldown transistor being activated when the input of said input logic for receiving the input digital logic signals is at a high logic level for maintaining the input at supply voltage.

8. The circuit of claim 1, wherein said input logic comprises:

a NAND gate comprising an equal number of N-type and P-type CMOS transistors;

a NOR gate comprising an equal number of N-type and P-type CMOS transistors; and wherein said at least one transistor comprises:

an N-type CMOS transistor coupling an output of said NAND gate to ground voltage when activated; and a P-type CMOS transistor coupling an output of said NOR gate to supply voltage when activated.

9. The circuit of claim 8 further comprising:

an isolation transistor coupled to an input of said input logic for receiving the input digital logic signals of a first or a second group of logic levels, for isolating an input voltage higher than a supply voltage of the circuit.

10. The circuit of claim 9, further comprising:

a pulldown transistor, coupling the input of said input logic for receiving the input digital logic signals of a first or a second group of logic levels to supply voltage, said pulldown transistor being activated when the input of said input logic for receiving the input digital logic signals is at a high logic level for maintaining the input at supply voltage.

11. The circuit of claim 8, further comprising:

means for raising a switching threshold voltage of said input logic during a low to high transition of said input digital logic signals; and means for lowering a switching threshold voltage of said input logic during a high to low transition of said input digital logic signals.

12. The circuit of claim 1, wherein the digital logic signals of a first group comprise Transistor-Transistor Logic (TTL) logic level signals.

13. The circuit of claim 12, wherein the digital logic signals of a first group comprise TTL logic level signals having a nominal low level logic voltage of 0.4 Volts and a nominal high level logic voltage of 2.4 Volts.

14. The circuit of claim 12, wherein the digital logic signals of a second group of logic levels comprise Complimentary Metal Oxide Semiconductor (CMOS) logic level signals.

15. The circuit of claim 14, wherein the digital logic signals of a first group comprise CMOS logic level signals having a nominal low level logic voltage of 0 Volts and a nominal high level logic voltage equal to supply voltage.

* * * * *